(12) United States Patent
Han (10) Patent No.: US 6,774,477 B2
(45) Date of Patent: Aug. 10, 2004

(54) STRUCTURE AND METHOD OF STACKING MULTIPLE SEMICONDUCTOR SUBSTRATES OF A COMPOSITE SEMICONDUCTOR DEVICE

(75) Inventor: Il-seok Han, Icheon-shi (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 10/331,023

(22) Filed: Dec. 27, 2002

(65) Prior Publication Data

US 2004/0032017 A1 Feb. 19, 2004

(30) Foreign Application Priority Data

Aug. 13, 2002 (KR) ................................ 10-2002-0047783

(51) Int. Cl.⁷ ............................................. H01L 23/02
(52) U.S. Cl. ...................... 257/686; 257/777; 257/797; 257/723; 257/724; 257/784; 438/686; 438/107; 438/109; 438/108; 438/118; 438/455; 438/458
(58) Field of Search ................................ 257/777, 778, 257/776; 438/686, 118, 25, 455

(56) References Cited

U.S. PATENT DOCUMENTS

| 5,654,220 A | * | 8/1997 | Leedy .......................... 438/25 |
| 5,952,132 A | | 9/1999 | King et al. |
| 6,127,075 A | | 10/2000 | Hsu |
| 6,153,928 A | * | 11/2000 | Cho ........................... 257/686 |
| 6,218,200 B1 | | 4/2001 | Chen et al. |
| 6,566,232 B1 | * | 5/2003 | Hara et al. .................. 438/455 |
| 6,686,222 B2 | * | 2/2004 | Omizo et al. ............... 438/107 |
| 2001/0000650 A1 | * | 5/2001 | Akram et al. ............... 324/765 |
| 2002/0140107 A1 | * | 10/2002 | Kato et al. .................. 257/777 |
| 2002/0187588 A1 | * | 12/2002 | Omizo et al. ............... 438/118 |

* cited by examiner

Primary Examiner—Minhloan Tran
Assistant Examiner—Fazli Erdem
(74) Attorney, Agent, or Firm—Marshall, Gerstein & Borun LLP

(57) ABSTRACT

A structure and method of stacking multiple semiconductor substrates of a composite semiconductor device are disclosed. The structure and method of stacking multiple semiconductor substrates of a composite semiconductor device can align the semiconductor substrates when stacking and bonding the semiconductor substrates after fabricating two or more semiconductor devices of the composite semiconductor device onto the semiconductor substrates.

34 Claims, 5 Drawing Sheets

STRUCTURE AND METHOD OF STACKING MULTIPLE SEMICONDUCTOR SUBSTRATES OF A COMPOSITE SEMICONDUCTOR DEVICE

BACKGROUND OF THE INVENTION

1. Field of the Invention

The present invention relates to a structure and method of stacking multiple semiconductor substrates of a composite semiconductor device, and more particularly, to a structure and method of stacking multiple semiconductor substrates of a composite semiconductor device which can align the semiconductor substrates when stacking and bonding the semiconductor substrates after fabricating two or more semiconductor devices of the composite semiconductor device on a semiconductor substrate.

2. Description of the Related Art

Recently, semiconductor devices used for a composite semiconductor device such as MML (Merged Memory and Logic), SOC (System on Chip) or the like in the field of system integrated circuits have made a rapid progress. Generally, the semiconductor device has a memory device, such as DRAM (Dynamic Random Access Memory), SRAM (Static Random Access Memory), Flash EEPROM, EPROM or the like, and a logic device, which is formed on a semiconductor substrate.

In a fabrication method of such a composite semiconductor device, if the size of a memory increases, the overall size of the semiconductor device also increases since the memory device and the logic device area formed on the same semiconductor substrate. Therefore, there is a problem in developing various products such as a video controller mounted with a high capacity memory, a SRAM, a MCU (Micro Controller Unit) mounted with a flash memory. Also, it is difficult to optimize the logic device requiring a high speed because the composite semiconductor device is fabricated based a memory process.

Hence, the composite semiconductor device with a memory device and logic device is implemented as a single device by separately forming the memory device and the logic device on different semiconductor substrates and then stacking and joining these semiconductor substrates to form multiple substrates.

Figure 1:
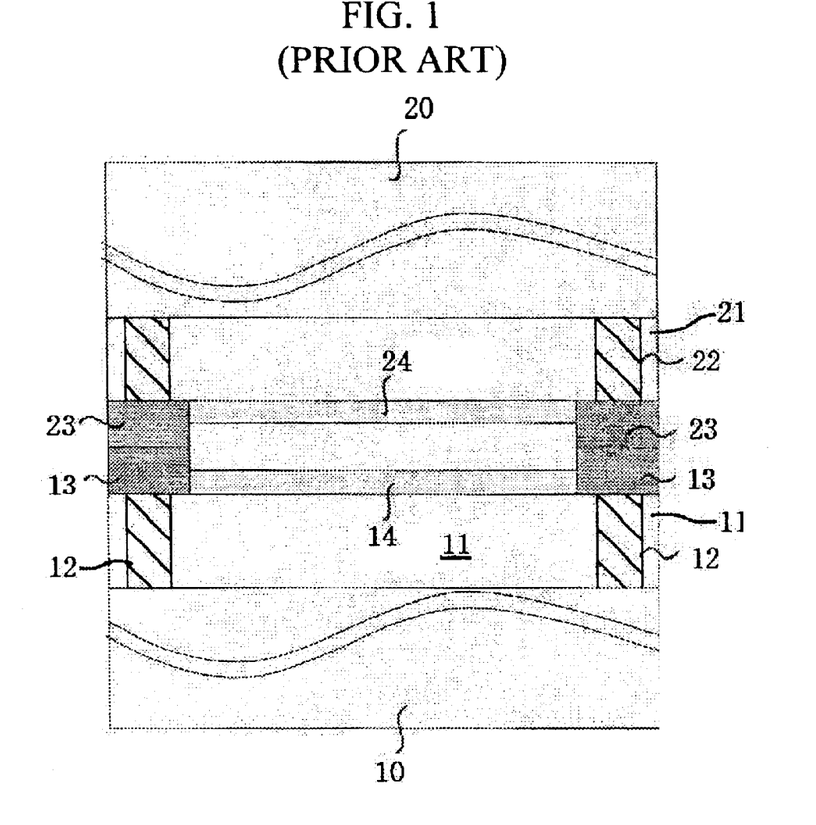
FIG. 1 is a process chart showing a method of stacking multiple semiconductor substrates of a composite semiconductor device according to the prior art.

FIG. 1 is a process chart showing a method of stacking multiple semiconductor substrates of a composite semiconductor device according to the prior art. Referring to FIG. 1, a method for fabricating a memory device and a logic device on multiple semiconductor substrates according to the prior art will now be explained.

As shown in FIG. 1, a first interlayer insulating layer 11 is formed on a first semiconductor substrate 10 in which a memory device (not shown) is provided. Gate electrodes, source/drain electrodes of a memory cell transistor serving as a memory device is formed on the first semiconductor substrate 10. Multiple poly-silicon layers and multiple metal wires forming bit lines, capacitors and the like of the memory cell transistor are formed on the first interlayer insulating layer 11. Contact holes for electrically connecting source/drain regions of the memory cell transistor and via holes for connecting a metal wire to another metal wire are formed. Next, first via holes 12 vertically connected with a final metal wire of the memory cell transistor are formed on the first interlayer insulating layer 11 and first bonding pads 13 connected with the first via holes 12 are formed on the first interlayer insulating layer 11. A first protection layer 14 is formed on the structure with the first bonding pads 13 and then the first bonding pads 13 are exposed by selectively etching back the first protection layer 14.

Subsequently, a second interlayer insulating layer 21 is formed on a second semiconductor substrate 20 in which a logic device (not shown) is provided. Gate electrodes, source/drain electrodes of the logic transistor serving as a logic device are formed on the second semiconductor substrate 20. Multiple metal wires of the logic transistor are formed on the second inter-insulating layer 21. Contact holes for electrically connecting source/drain regions of the logic transistor and via holes for connecting a metal wire to another metal wire are formed. Next, second via holes 22 vertically connected with a final metal wire of the logic transistor are formed on the second interlayer insulating layer 21 and second bonding pads 23 connected with the second via holes 22 are formed on the second interlayer insulating layer 21. A second protection layer 24 is formed on the structure with the second bonding pads 23 and then the second bonding pads 23 are exposed by selectively etching back the second protection layer 24.

As shown in FIG. 1, in order to connect each memory device and logic device formed on the first semiconductor substrate 10 and the second semiconductor substrate 20, respectively, the second semiconductor is turned upside down so as to join the first bonding pads 13 of the first semiconductor substrate 10 to the second bonding pads 23 of the second semiconductor substrate 20 and the first and second semiconductors 10 and 20 are stacked. When the stacked first and second semiconductor substrates 10 and 20 are annealed at a temperature of 300° C. to 450° C., the first bonding pads 13 of the first semiconductor 10 and the second bonding pads 23 of the second semiconductor 20 are electrically connected.

Since a conventional stacking technique for multiple semiconductor substrates of a composite semiconductor device, as mentioned above, does not use a mask alignment key for joining the first and second semiconductor substrates 10 and 20, a misalignment of the first bonding pads 13 and the second bonding pads 23 is caused, making it difficult to electrically connect the first bonding pads 13 and the second bonding pads 23.

SUMMARY OF THE INVENTION

It is, therefore, an object of the present invention to provide a structure for stacking multiple semiconductor substrates of a composite semiconductor device which can align the semiconductor substrates using align marks when joining bonding pads of semiconductor substrates and stacking them by providing the alignment marks as well as the bonding pads on the upper surface of the semiconductor substrates having two or more semiconductor devices of a composite semiconductor device formed thereon.

It is another object of the present invention to provide a method of stacking multiple semiconductor substrates of a composite semiconductor device which can accurately align the multiple semiconductor substrates by joining bonding pads of the semiconductor substrates and stacking them after fabricating two or more semiconductor devices of the composite semiconductor device on the semiconductor substrates, forming alignment marks as well as the bonding pads on the upper surface of each semiconductor substrate and then aligning the semiconductor substrates using these alignment marks.

In accordance with an aspect of the present invention, there is provided a structure for stacking multiple semiconductor substrates of a composite semiconductor device, wherein the composite semiconductor device has at least two semiconductor devices, the structure comprising: a first semiconductor substrate having a first interlayer insulating layer for a first semiconductor device, first via holes formed in the first interlayer insulating layer for connecting the first semiconductor device, first bonding pads formed on the upper surface of the first interlayer insulating layer and connected with the first via holes and first alignment marks arranged on the outer periphery of the substrate; and a second semiconductor substrate having a second interlayer insulating layer for a second semiconductor device, second via holes formed on the second interlayer insulating layer for connecting the second semiconductor device, second bonding pads formed on the upper surface of the second interlayer insulating layer and connected with the second via holes and second alignment marks arranged on the outer periphery of the substrate; and wherein the first bonding pads of the first semiconductor substrate and the second bonding pads of the second semiconductor substrate are joined by aligning the first alignment marks of the first semiconductor substrate and the second alignment marks of the second semiconductor substrate.

In accordance with another aspect of the present invention, there is provided a method of stacking multiple semiconductor substrates of a composite semiconductor device, wherein the composite semiconductor device has at least two semiconductor devices, the method comprising the steps of: forming a first semiconductor substrate having a first inter-insulating layer for a first semiconductor device, first via holes formed in the first interlayer insulating layer for connecting the first semiconductor device, first bonding pads formed on the upper surface of the first interlayer insulating layer and connected with the first via holes and first alignment marks arranged on the outer periphery of the substrate layer; forming a second semiconductor substrate having a second interlayer insulating layer for a second semiconductor device, second via holes formed in the second inter-insulating layer for connecting the second semiconductor device, second bonding pads formed on the upper surface of the first interlayer insulating layer and connected with the second via holes and second alignment marks arranged on the outer periphery of the substrate; aligning the marks of the first semiconductor substrate and the marks of the second semiconductor substrate; and joining the first bonding pads of the first semiconductor substrate and the second bonding pads of the second semiconductor substrate.

BRIEF DESCRIPTION OF THE DRAWINGS

The above objects, features and advantages of the present invention will become more apparent from the following detailed description when taken in conjunction with the accompanying drawings, in which.

DETAILED DESCRIPTION OF THE PREFERRED EMBODIMENT

A preferred embodiment of the present invention will now be described with reference to the accompanying drawings.

Figure 2A:
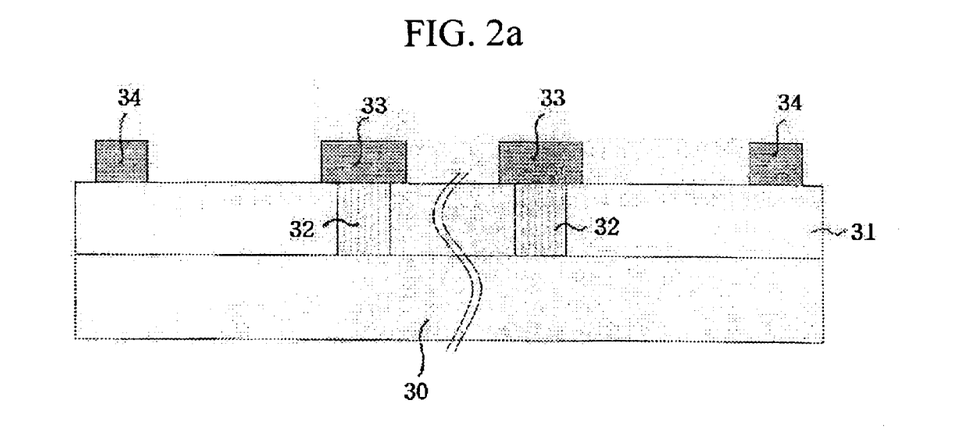
FIGS. 2a to 2c are process charts showing a method of stacking multiple semiconductor substrates of a composite semiconductor device according to the present invention.
Figure 2B:
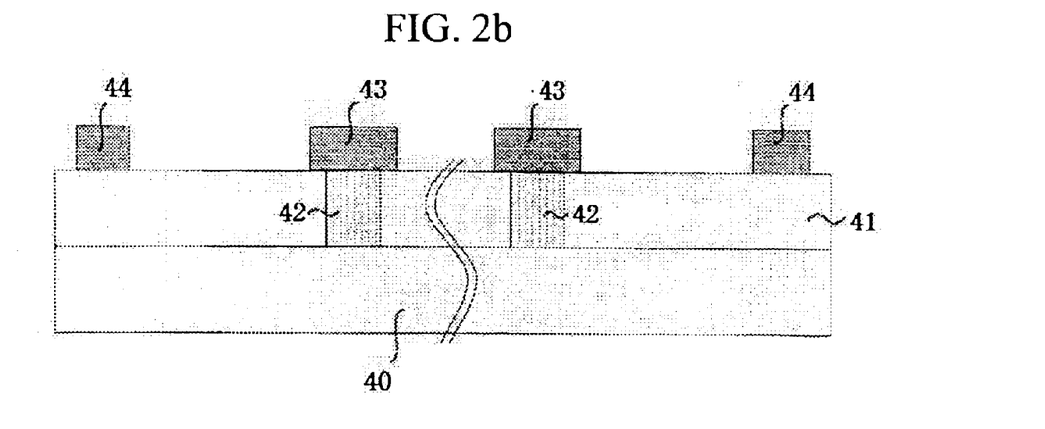
Figure 2C:
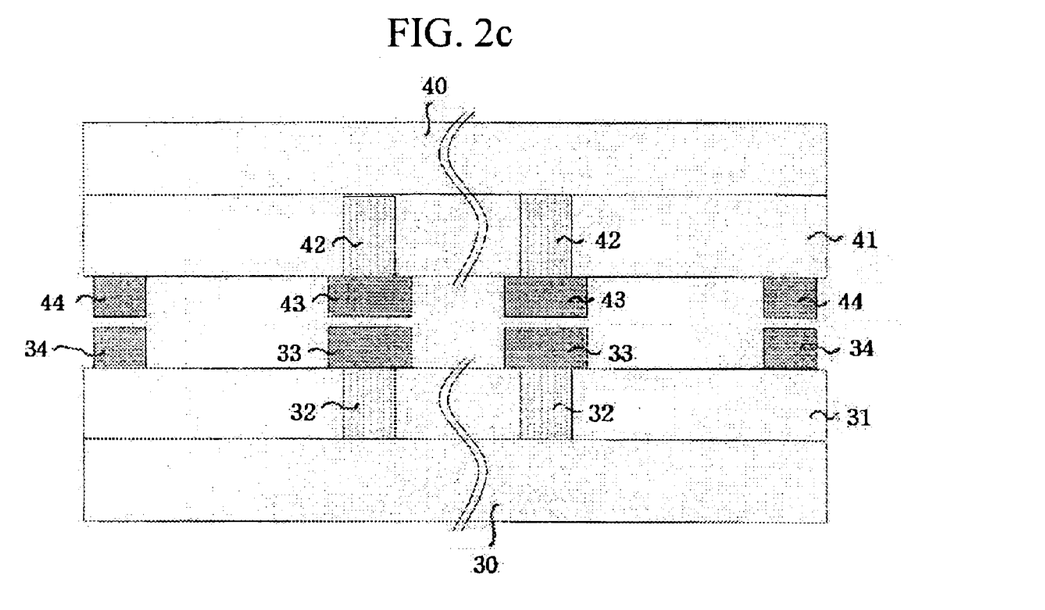

FIGS. 2a to 2c are process charts showing a method of stacking multiple semiconductor substrates of a composite semiconductor device according to the present invention. Referring to FIGS. 2a to 2c, the stacking technique for multiple semiconductor substrates of a composite semiconductor device according to the present invention will be explained. In the present invention, a first semiconductor device of the composite semiconductor device is a memory device such as DRAM, SRAM or flash memory device and a second semiconductor device is a logic device.

As shown in FIG. 2a, an inter-insulating layer 31 is formed on a first semiconductor substrate 30 on which a memory device (not shown) is provided. Gate electrodes, source/drain electrodes and the like of a memory cell transistor serving as a memory device is formed on the first semiconductor substrate 30. Multiple poly-silicon layers and multiple metal wires forming bit lines, capacitors of the memory cell transistor are formed on the first interlayer insulating layer 31. Contact holes for electrically connecting source/drain regions of the memory cell transistor and via holes for connecting a metal wire to another metal wire are formed. Next, first via holes 32 vertically connected with a final metal wire of the memory cell transistor are formed on the first inter-insulating layer 31. Then, first bonding pads 33 connected with the first via holes 32 are formed on the first interlayer insulating layer 31 and at the same time first align marks 34 are arranged on the periphery of the first semiconductor substrate 30. The first bonding pads 33 and the first align marks 34 are made of metal and have a thickness of 10000 Å to 15000 Å.

Though not shown in the drawings, a first protection layer (not shown) is formed on the structure with the first bonding pads 33 and the first align marks 34 and then the first bonding pads 33 and the first align marks 34 are exposed by selectively etching back the first protection layer.

As shown in FIG. 2b, a second inter-insulating layer 41 is formed on a second semiconductor substrate 40 in which a logic device (not shown) is provided. Gate electrodes, source/drain electrodes and the like of a logic transistor serving as a logic device are formed on the second semiconductor substrate 40. Multiple metal wires of the logic transistor are formed on the second inter-insulating layer 41. Contact holes for electrically connecting source/drain regions of the logic transistor and via holes for connecting a metal wire to another metal wire are formed. Next, second via holes 42 vertically connected with a final metal wire of the logic transistor are formed on the second inter-insulating layer 41. Then, second bonding pads 43 connected with the second via holes 42 are formed on the second inter-insulating layer 41 and at the same time second alignment marks 44 are arranged on the periphery of the second semiconductor substrate 40. The second bonding pads 43 and the second alignment marks 44 are made of metal and have a thickness of 10000 Å to 15000 Å.

Though not shown in the drawings, a second protection layer (not shown) is formed on the structure with the second bonding pads 43 and the second align marks 44 and then the second bonding pads 43 and the second align marks 44 are exposed by selectively etching back the second protection layer.

As shown in FIG. 2c, the first align marks 34 of the first semiconductor substrate 30 and the second align marks 44 of the second semiconductor substrate 40 are aligned using an alignment apparatus. Then, the aligned first bonding pads 33 of the first semiconductor substrate 30 and second bonding pads 43 of the second semiconductor substrate 40 are joined to connect the memory cell transistor of the first semiconductor substrate 30 and the logic transistor of the second semiconductor substrate 40. When the first and second semiconductor substrates 30 and 40 are annealed at a temperature of 300° C. to 450° C., the first bonding pads 32 of the first semiconductor 30 and the second bonding pads 42 of the second semiconductor 40 are electrically connected.

Accordingly, the present invention can stack multiple semiconductor substrates without misalignment by joining bonding pads after separately forming a memory device and a logic device on different semiconductor substrates and aligning the semiconductor substrates using align marks formed on each of the substrates.

Also, the present invention can form alignment marks along with bonding pads in a final wiring process during the process of forming a memory device or logic device on a semiconductor substrate without a process for forming an alignment key on each semiconductor substrate corresponding to the alignment marks, thereby simplifying the fabrication process.

After joining the bonding pads 33 and 43 of the first and second semiconductor substrates 30 and 40, it is also possible to align and stack a plurality of semiconductor substrates in a multiple structure by forming additional alignment marks on the back surface of the second semiconductor substrate 40.

Figure 3A:
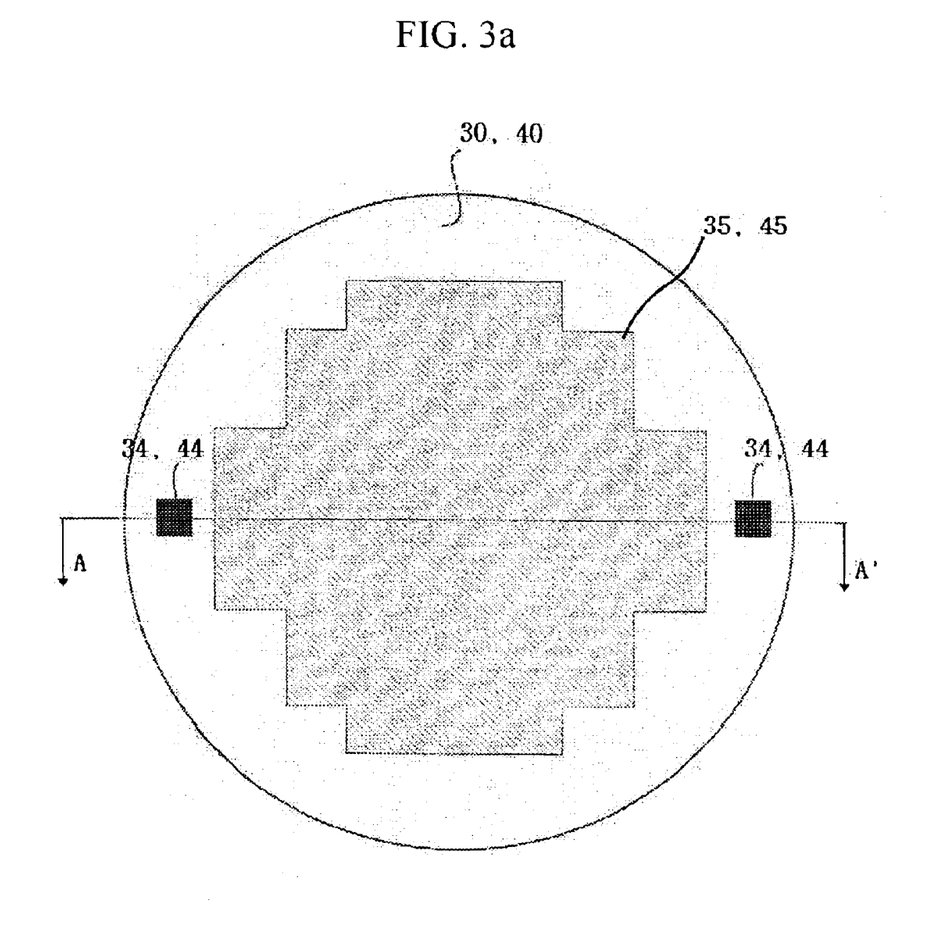
FIGS. 3a and 3b are a plane view and a vertical cross-sectional view showing alignment marks of the multiple semiconductor substrates of the composite semiconductor device according to the present invention.
Figure 3B:
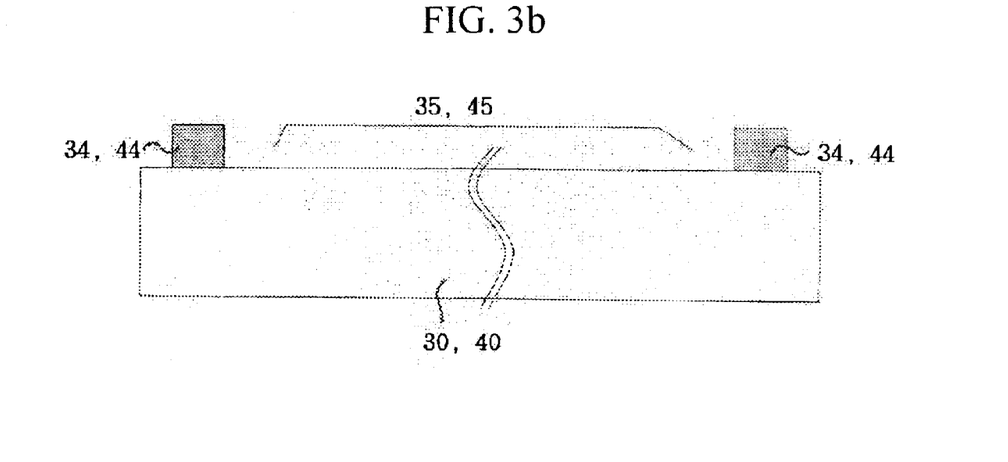

FIGS. 3a and 3b are a plane view and a vertical cross-sectional view showing alignment marks of the multiple semiconductor substrates of the composite semiconductor device according to the present invention.

As shown in FIGS. 3a and 3b, pairs of first and second align marks 34 and 44 are fabricated on the periphery of the substrate in a fabrication process of the bonding pads of the first semiconductor substrate 30 and the second semiconductor substrate 40. On the semiconductor substrates 30 and 40 between the first and second alignment marks 34 and 44 is shown regions 35 and 45, in which each semiconductor device, for example, a memory device and a logic device, are formed.

Figure 4A:
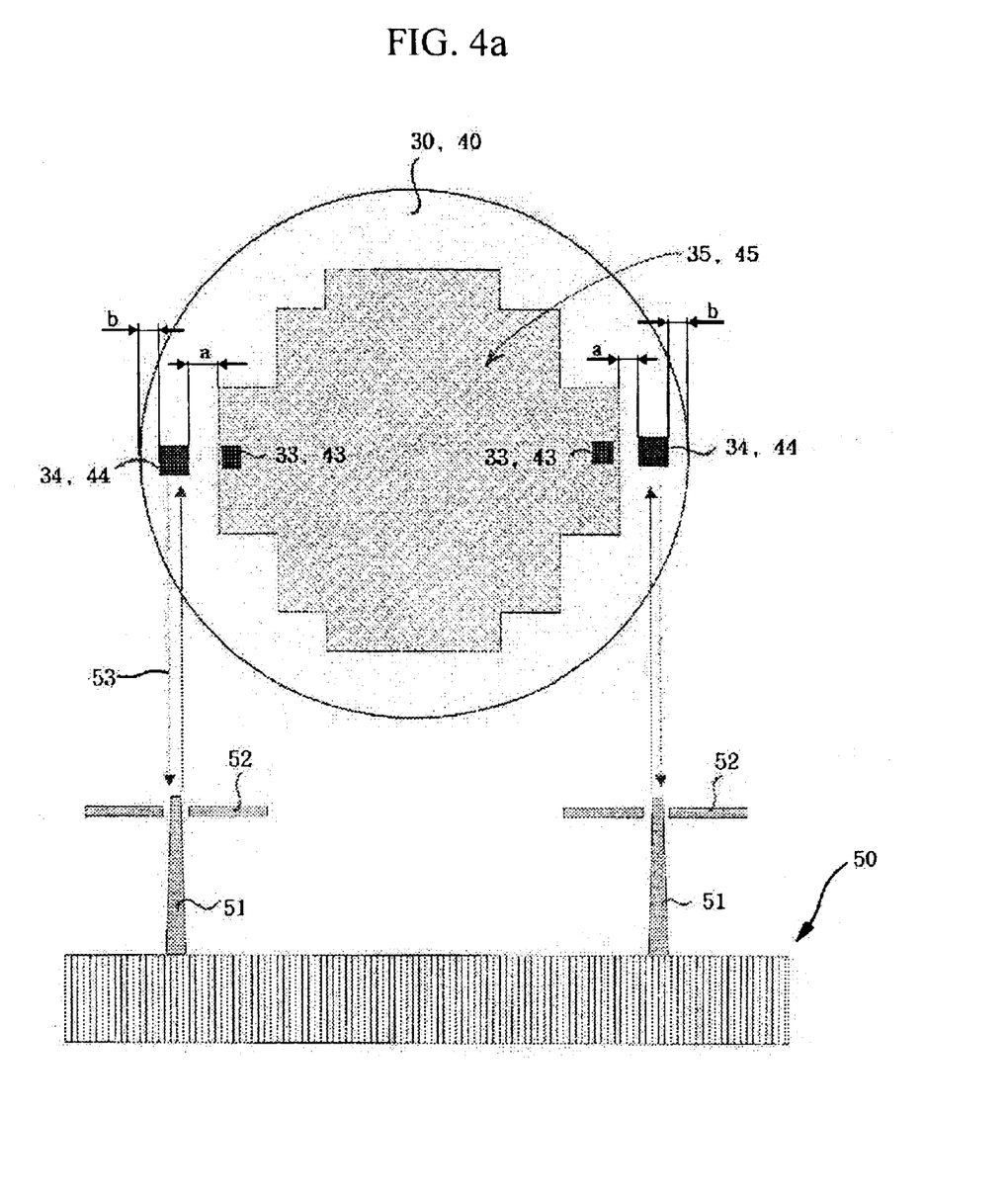
FIGS. 4a and 4b are a plane view and a vertical cross-sectional view showing an aligning method for the multiple semiconductor substrates of the composite semiconductor device according to the present invention.
Figure 4B:
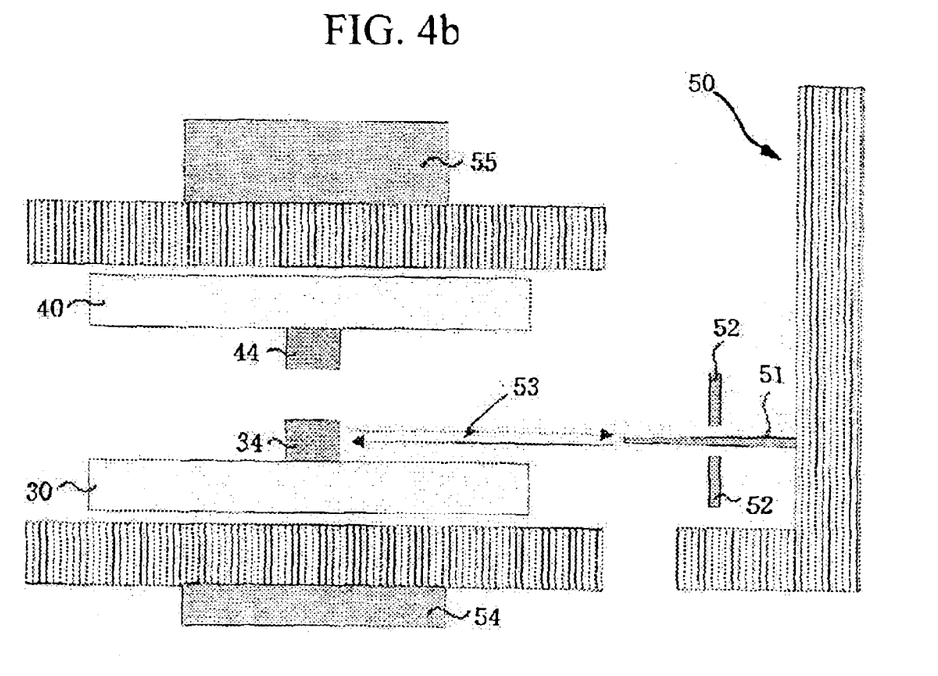

FIGS. 4a and 4b are a plane view and a vertical cross-sectional view showing an aligning method for the multiple semiconductor substrates of the composite semiconductor device according to the present invention.

Referring to FIG. 4a, the first alignment marks 34 of the first semiconductor substrate 30 and the second alignment marks 44 of the second semiconductor substrate 40 will be further explained before explaining the alignment method of the present invention.

The first and second alignment marks 34 and 44 are formed in a fabrication process of the bonding pads without additional processing. The first and second align marks 34 and 44 are formed symmetrically on the left and right sides of the outer periphery of the semiconductor substrates 30 and 40. The first and second alignment marks 34 and 44 each have a size of 10 μm to 30 μm. The first and second alignment marks 34 and 44 are located at a distance more than 1 mm from the first and second bonding pads 33 and 44 of the semiconductor substrates 30 and 40 as shown in drawing (a) and are located inward 10 mm to 20 mm from the left and right side edges of the semiconductor substrates 30 and 40 as shown in drawing (b), thereby preventing wrong operation caused by the bonding pads during the alignment process.

FIGS. 4a and 4b are a plane view and a vertical cross-sectional view showing an alignment method for the multiple semiconductor substrates of the composite semiconductor device according to the present invention.

An alignment apparatus 50 aligns the first semiconductor substrate 30 by projecting X-rays having a wavelength of 4 Å to 50 Å toward the first alignment marks 34 existing on the first semiconductor substrate 30 using a X-ray projector 51 and detecting the X-rays reflected from the first alignment marks 34 by a X-ray detector 52. If the reflected light of the first align marks 34 does not reach the X-ray detector 52 100%, the X-ray projector 51 is aligned laterally or vertically. That is, if the first alignment marks 34 of the X-ray projector 51 are not accurately aligned, the light source of the X-rays projected from the X-ray projector 51 is strongly absorbed into the air or is reflected onto the first inter-insulating layer of the first semiconductor substrate 30 having a different reflectivity. In this case, the reflected light of the first align marks 34 does not reach the X-ray detector 52 100%. Thus the X-ray projector 51 is aligned to find the position where the amount of light reflected is 100%. Then, the alignment apparatus 50 obtains the coordinate values of the first align marks 34.

The alignment apparatus 50 stores the coordinate values of the first align marks 34 of the first semiconductor substrate 30 aligned in a memory (not shown).

The alignment apparatus 50 aligns the second alignment marks 44 of the second semiconductor substrate 40 using the coordinate values of the first alignment marks 34 stored in the memory as a reference value. That is, the second semiconductor substrate 40 is aligned by projecting X-rays having a wavelength of 4 Å to 50 Å toward the second alignment marks 44 existing on the second semiconductor substrate 40 using the X-ray projector 51 and detecting the X-rays reflected from the second alignment marks 44 by the X-ray detector 52. If the reflected light of the second align marks 44 does not reach the X-ray detector 52 100%, the coordinate values of the second align marks 44 are obtained by aligning the X-ray projector 51 laterally or vertically and finding the position where the reflected light reaches 100%.

The alignment apparatus 50 stores the coordinate values of the second alignment marks 44 of the second semiconductor substrate 40 in the memory.

The alignment apparatus 50 aligns the first semiconductor substrate 30 and the second semiconductor substrate 40 by comparing the stored coordinate values of the first alignment marks 34 and the stored coordinate values of the second alignment marks 44 and moving the first semiconductor substrate 30 or the second semiconductor substrate 40 a distance as great as the difference between the coordinate values. For example, as shown in FIG. 4b, if the first semiconductor substrate 30 is mounted on a fixed stage 54 and the second semiconductor substrate 40 is mounted on a movable stage 55 capable of alignment, the alignment apparatus 50 moves the movable stage 55 attached to the back surface of the second semiconductor substrate 40 by a vacuum a distance as great as the difference between the coordinate values of the first and second alignment marks 34 and 44 and aligns the first and second semiconductor substrates 30 and 40.

Then, the first semiconductor substrate 30 and the second semiconductor substrate 40 are stacked and at the same time the semiconductor devices of the semiconductor substrates are electrically connected by joining the first bonding pads of the first semiconductor substrate 30 and second bonding pads of the second semiconductor substrate 40 by a thermal process.

As explained above, the present invention can align the semiconductor substrates using alignment marks when joining bonding pads of semiconductor substrates and stacking them by providing the alignment marks on the upper surface of the semiconductor substrates having two or more semiconductor devices of a composite semiconductor device formed thereon.

Accordingly, the present invention can prevent a defective electric connection between the bonding pads caused by misalignment and thus improve product yield by aligning the semiconductor substrates using the alignment marks when implementing a composite semiconductor substrate by stacking multiple semiconductor substrates.

It will be apparent to those skilled in the art that various modifications can be made to the present invention without deviating from the spirit or scope of the invention. Thus, it is intended that the present invention cover the modification of this invention provided they come within the scope of the appended claims and their equivalents.

What is claimed is:

1. A structure of stacking multiple semiconductor substrates of a composite semiconductor device, wherein the composite semiconductor device has at least two semiconductor devices, the structure comprising:

a first semiconductor substrate having a first inter-insulating layer for a first semiconductor device, first via holes formed in the first inter-insulating layer for connecting the first semiconductor device, first bonding pads formed on the upper surface of the first inter-insultaing layer and connected with the first via holes and first alignment marks arranged on the outer periphery of the substrate;

a second semiconductor substrate having a second inter-insulating layer for a second semiconductor device, second via holes formed in the second inter-insulating layer for connecting the second semiconductor device, second bonding pads formed on the upper surface of the second inter-insultaing layer and connected with the second via holes and second alignment marks arranged on the outer periphery of the substrate;

wherein the first bonding pads of the first semiconductor substrate and the second bonding pads of the second semiconductor substrate are joined by aligning the first alignment marks of the first semiconductor substrate and the second alignment maks of the second semiconductor substrate; and wherein a plurality of semiconductor substrates are aligned and joined by forming additional alignment marks on the back surface of the second semiconductor substrate after joining the bonding pads of the first and second semiconductor substrate.

2. A structure of stacking multiple semiconductor substrates of a composite semiconductor device, wherein the composite semiconductor device has at least two semiconductor devices, the structure comprising:

a first semiconductor substrate having a first inter-insulating layer for a first semiconductor device, first via holes formed in the first inter-insulating layer for connecting the first semiconductor device, first bonding pads formed on the upper surface of the first inter-insultaing layer and connected with the first via holes and first alignment marks arranged on the outer periphery of the substrate;

a second semiconductor substrate having a second inter-insulating layer for a second semiconductor device, second via holes formed in the second inter-insulating layer for connecting the second semiconductor device, second bonding pads formed on the upper surface of the second inter-insultaing layer and connected with the second via holes and second alignment marks arranged on the outer periphery of the substrate;

wherein the first bonding pads of the first semiconductor substrate and the second bonding pads of the second semiconductor substrate are joined by aligning the first alignment marks of the first semiconductor substrate and the second alignment maks of the second semiconductor substrate; and wherein the first bonding pads and the second bonding pads are made of metal and have a thickness of 10000 Å to 15000 Å.

3. A structure of stacking multiple semiconductor substrates of a composite semiconductor device, wherein the composite semiconductor device has at least two semiconductor devices, the structure comprising:

a first semiconductor substrate having a first inter-insulating layer for a first semiconductor device, first via holes formed in the first inter-insulating layer for connecting the first semiconductor device, first bonding pads formed on the upper surface of the first inter-insultaing layer and connected with the first via holes and first alignment marks arranged on the outer periphery of the substrate;

a second semiconductor substrate having a second inter-insulating layer for a second semiconductor device, second via holes formed in the second inter-insulating layer for connecting the second semiconductor device, second bonding pads formed on the upper surface of the second inter-insultaing layer and connected with the second via holes and second alignment marks arranged on the outer periphery of the substrate;

wherein the first bonding pads of the first semiconductor substrate and the second bonding pads of the second semiconductor substrate are joined by aligning the first alignment marks of the first semiconductor substrate and the second alignment maks of the second semiconductor substrate; and wherein the first and second alignment marks are made of metal and have a thickness of 10000 Å to 15000 Å.

4. The structure of claim 1, wherein the first semiconductor device is a memory device and the second semiconductor device is a logic device.

5. A structure of stacking multiple semiconductor substrates of a composite semiconductor device, wherein the composite semiconductor device has at least two semiconductor devices, the structure comprising:

a first semiconductor substrate having a first inter-insulating layer for a first semiconductor device, first via holes formed in the first inter-insulating layer for connecting the first semiconductor device, first bonding pads formed on the upper surface of the first inter-insultaing layer and connected with the first via holes and first alignment marks arranged on the outer periphery of the substrate;

a second semiconductor substrate having a second inter-insulating layer for a second semiconductor device, second via holes formed in the second inter-insulating layer for connecting the second semiconductor device, second bonding pads formed on the upper surface of the second inter-insultaing layer and connected with the second via holes and second alignment marks arranged on the outer periphery of the substrate;

wherein the first bonding pads of the first semiconductor substrate and the second bonding pads of the second semiconductor substrate are joined by aligning the first alignment marks of the first semiconductor substrate and the second alignment maks of the second semiconductor substrate; and wherein the first and second alignment marks are formed symmetrically on the left and right sides of the outer periphery of the semiconductor substrates, having a size of 10 µm to 30 µm and are located inward 10 mm to 20 mm from the left and right side edges of the semiconductor substrates.

6. A structure of stacking multiple semiconductor substrates of a composite semiconductor device, wherein the composite semiconductor device has at least two semiconductor devices, the structure comprising:

a first semiconductor substrate having a first inter-insulating layer for a first semiconductor device, first via holes formed in the first inter-insulating layer for connecting the first semiconductor device, first bonding pads formed on the upper surface of the first inter-insultaing layer and connected with the first via holes and first alignment marks arranged on the outer periphery of the substrate;

a second semiconductor substrate having a second inter-insulating layer for a second semiconductor device, second via holes formed in the second inter-insulating layer for connecting the second semiconductor device, second bonding pads formed on the upper surface of the second inter-insultaing layer and connected with the second via holes and second alignment marks arranged on the outer periphery of the substrate;

wherein the first bonding pads of the first semiconductor substrate and the second bonding pads of the second semiconductor substrate are joined by aligning the first alignment marks of the first semiconductor substrate and the second alignment maks of the second semiconductor substrate; and wherein the first and second align marks are located at a distance more than 1 mm from the first and second bonding pads of the semiconductor substrates.

7. A method of stacking multiple semiconductor substrates of a composite semiconductor device, wherein the composite semiconductor device has at least two semiconductor devices, the method comprising the steps of:

forming a first semiconductor substrate having a first inter-insultaing layer for a first semiconductor device, first via holes formed in the first inter-insulating layer for connecting the first semiconductor device, first bonding pads formed on the upper surface of the first inter-insulating layer and connected with the first via holes and first align marks arranged on the outer periphery of the substrate layer;

forming a second semiconductor substrate having a second inter-insulating layer for a second semiconductor device, second via holes formed in the second inter-insulating layer for connecting the second semiconductor device, second bonding pads formed on the upper surface of the second inter-insulating layer and connected with the second via holes and second alignment marks arranged on the outer periphery of the substrate;

aligning the first alignment marks of the first semiconductor substrate by an alignment apparatus by protecting X-rays toward the first align marks existing on the first semiconductor substrate using a X-ray projector and detecting the X-rays reflected from the first alignment marks by a X-ray detector;

storing the coordinate values of the alignment marks of the aligned first semiconductor substrate in a memory of the alignment apparatus;

aligning the second alignment marks of the second semiconductor substrate; and joining the first bonding pads of the first semiconductor substrate and the second bonding pads of the second semiconductor substrate.

8. The method of claim 7, wherein the aligning step further comprises the steps of:

aligning the second semiconductor substrate by projecting X-rays toward the second alignment marks existing on the second semiconductor substrate using the X-ray projector and detecting the X-rays reflected from the second alignment marks by the X-ray detector;

storing the coordinate values of the alignment marks of the aligned second semiconductor substrate in a memory of the alignment apparatus; and aligning the first semiconductor substrate and the second semiconductor substrate by the alignment apparatus by comparing the coordinate values of the first alignment marks and the coordinate values of the second alignment marks and moving the first semiconductor substrate or the second semiconductor substrate as much as the difference between the coordinate values.

9. The method of claim 8, wherein the X-rays projected toward the alignment marks of the first and second semiconductor substrates have wavelengths of 4 Å to 50 Å.

10. The method of claim 8, wherein, if the reflected light of the first or second alignment marks does not reach the X-ray detector 100%, the coordinate values of the first or second alignment marks are obtained by aligning the X-ray projector laterally or vertically and finding a position where all light is reflected.

11. The structure of claim 1, wherein the first bonding pads and the second bonding pads are made of metal and have a thickness of 10000 Å to 15000 Å.

12. The structure of claim 1, wherein first and second alignment marks are made of metal and have a thickness of 10000 Å to 15000 Å.

13. The structure of claim 1, wherein the first and second alignment marks are formed symmetrically on the left and right sides of the outer periphery of the semiconductor substrates, having a size of 10 µm to 30 µm and are located inward 10 mm to 20 mm from the left and right side edges of the semiconductor substrates.

14. The structure of claim 1, wherein the first and second align marks are located at a distance more than 1 mm from the first and second bonding pads of the semiconductor substrates.

15. The structure of claim 2, wherein first and second alignment marks are made of metal and have a thickness of 10000 Å to 15000 Å.

16. The structure of claim 2, wherein the first semiconductor device is a memory device and the second semiconductor device is a logic device.

17. The structure of claim 2, wherein the first and second alignment marks are formed symmetrically on the left and right sides of the outer periphery of the semiconductor substrates, having a size of 10 µm to 30 µm and are located inward 10 mm to 20 mm from the left and right side edges of the semiconductor substrates.

18. The structure of claim 2, wherein the first and second align marks are located at a distance more than 1 mm from the first and second bonding pads of the semiconductor substrates.

19. The structure of claim 2, wherein a plurality of semiconductor substrates are aligned and joined by forming additional alignment marks on the back surface of the second semiconductor substrate after joining the bonding pads of the first and second semiconductor substrate.

20. The structure of claim 3, wherein the first bonding pads and the second bonding pads are made of metal and have a thickness of 10000 Å to 15000 Å.

21. The structure of claim 3, wherein the first semiconductor device is a memory device and the second semiconductor device is a logic device.

22. The structure of claim 3, wherein the first and second alignment marks are formed symmetrically on the left and right sides of the outer periphery of the semiconductor substrates, having a size of 10 μm to 30 μm and are located inward 10 mm to 20 mm from the left and right side edges of the semiconductor substrates.

23. The structure of claim 3, wherein the first and second align marks are located at a distance more than 1 mm from the first and second bonding pads of the semiconductor substrates.

24. The structure of claim 3, wherein a plurality of semiconductor substrates are aligned and joined by forming additional alignment marks on the back surface of the second semiconductor substrate after joining the bonding pads of the first and second semiconductor substrate.

25. The structure of claim 5, wherein the first bonding pads and the second bonding pads are made of metal and have a thickness of 10000 Å to 15000 Å.

26. The structure of claim 5, wherein first and second alignment marks are made of metal and have a thickness of 10000 Å to 15000 Å.

27. The structure of claim 5, wherein the first semiconductor device is a memory device and the second semiconductor device is a logic device.

28. The structure of claim 5, wherein the first and second align marks are located at a distance more than 1 mm from the first and second bonding pads of the semiconductor substrates.

29. The structure of claim 5, wherein a plurality of semiconductor substrates are aligned and joined by forming additional alignment marks on the back surface of the second semiconductor substrate after joining the bonding pads of the first and second semiconductor substrate.

30. The structure of claim 6, wherein the first bonding pads and the second bonding pads are made of metal and have a thickness of 10000 Å to 15000 Å.

31. The structure of claim 6, wherein first and second alignment marks are made of metal and have a thickness of 10000 Å to 15000 Å.

32. The structure of claim 6, wherein the first semiconductor device is a memory device and the second semiconductor device is a logic device.

33. The structure of claim 6, wherein the first and second alignment marks are formed symmetrically on the left and right sides of the outer periphery of the semiconductor substrates, having a size of 10 μm to 30 μm and are located inward 10 mm to 20 mm from the left and right side edges of the semiconductor substrates.

34. The structure of claim 6, wherein a plurality of semiconductor substrates are aligned and joined by forming additional alignment marks on the back surface of the second semiconductor substrate after joining the bonding pads of the first and second semiconductor substrate.

* * * * *

UNITED STATES PATENT AND TRADEMARK OFFICE
CERTIFICATE OF CORRECTION

PATENT NO. : 6,774,477 B2
DATED : August 10, 2004
INVENTOR(S) : Il-seok Han

It is certified that error appears in the above-identified patent and that said Letters Patent is hereby corrected as shown below:

Column 7,
Lines 34 and 64-65, after "of the first" please delete "inter-insultaing" and insert
-- inter-insulating -- in its place.
Line 42, after "the second" please delete "inter-insultaing" and insert
-- inter-insulating -- in its place.
Line 49, after "alignment" please delete "maks" and insert -- marks -- in its place.

Column 8,
Lines 6, 36 and 67, after "the second" please delete "inter-insultaing" and insert
-- inter-insulating -- in its place.
Lines 14 and 43, after "alignment" please delete "maks" and insert -- marks --
in its place.
Lines 27-28 and 58-59, after "of the first" please delete "inter-insultaing" and
insert -- inter-insulating -- in its place.

Column 9,
Lines 7 and 40, after "alignment" please delete "maks" and insert -- marks -- in
its place.
Lines 24-25, after "of the first" please delete "inter-insultaing" and insert
-- inter-insulating -- in its place.
Line 33, after "the second" please delete "inter-insultaing" and insert
-- inter-insulating -- in its place.
Line 50, please delete "inter-insultaing" and insert -- inter-insulating --
in its place.

Signed and Sealed this

Tenth Day of May, 2005

JON W. DUDAS
*Director of the United States Patent and Trademark Office*